United States Patent
Lee

(10) Patent No.: US 6,735,727 B1
(45) Date of Patent: May 11, 2004

(54) FLASH MEMORY DEVICE WITH A NOVEL REDUNDANCY SELECTION CIRCUIT AND METHOD OF USING THE SAME

(75) Inventor: June Lee, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 317 days.

(21) Appl. No.: 09/587,166

(22) Filed: Jun. 2, 2000

(30) Foreign Application Priority Data

Jun. 3, 1999 (KR) .......................................... 1999-20445
Jun. 16, 1999 (KR) .......................................... 1999-22498

(51) Int. Cl.[7] .......................... G11C 29/00; G11C 7/00
(52) U.S. Cl. ........................ 714/711; 365/200; 365/201
(58) Field of Search ............................ 714/711, 710; 365/200, 201, 225.7

(56) References Cited

U.S. PATENT DOCUMENTS

| | | | | |
|---|---|---|---|---|
| 4,281,398 A | * | 7/1981 | McKenny et al. | 365/200 |
| 4,849,938 A | * | 7/1989 | Furutani et al. | 714/711 |
| 5,381,370 A | * | 1/1995 | Lacey et al. | 365/200 |
| 5,383,156 A | * | 1/1995 | Komatsu | 365/200 |
| 5,469,391 A | * | 11/1995 | Haraguchi | 365/200 |
| 5,506,807 A | * | 4/1996 | Ferrant et al. | 365/200 |
| 5,548,553 A | * | 8/1996 | Cooper et al. | 365/200 |
| 5,673,227 A | * | 9/1997 | Engles et al. | 365/200 |
| 5,675,543 A | * | 10/1997 | Rieger | 365/200 |
| 5,706,231 A | * | 1/1998 | Kokubo | 365/200 |
| 5,771,194 A | * | 6/1998 | Maeno | 365/200 |
| 5,771,195 A | * | 6/1998 | McClure | 365/200 |
| 5,848,003 A | * | 12/1998 | Nishikawa | 365/200 |
| 5,999,450 A | * | 12/1999 | Dallabora et al. | 365/185.09 |
| 6,021,512 A | * | 2/2000 | Lattimore et al. | 714/710 |
| 6,026,505 A | * | 2/2000 | Hedberg et al. | 714/711 |
| 6,052,767 A | * | 4/2000 | Matuki | 711/202 |
| 6,144,591 A | * | 11/2000 | Vlasenko et al. | 365/200 |
| 6,157,584 A | * | 12/2000 | Holst | 365/200 |

\* cited by examiner

*Primary Examiner*—Albert Decady
*Assistant Examiner*—Joseph D. Torres
(74) *Attorney, Agent, or Firm*—Marger Johnson & McCollom, P.C.

(57) ABSTRACT

A semiconductor memory device includes a redundancy selection circuit. The redundancy selection circuit includes generating means for simultaneously generating a first redundancy address and a second redundancy address in response to the column address at a read cycle. The first redundancy address indicates whether the column address is defective, and the second redundancy address indicates the place where a defective one of the first selected columns is positioned. The redundancy selection circuit further includes means for generating redundancy selection signals each corresponding to the first selected columns in response to the first and second redundancy addresses. According to the present invention, the redundancy selection circuit stores defective addresses by use of flash EEPROM cells similar to those of the main memory cell. Addresses can be programmed, without limitation in the redundancy selection circuit. All the redundant memory cells of an array are tested.

11 Claims, 8 Drawing Sheets

(Piror Art)

(Piror Art)

(Piror Art)

US 6,735,727 B1

FLASH MEMORY DEVICE WITH A NOVEL REDUNDANCY SELECTION CIRCUIT AND METHOD OF USING THE SAME

CROSS REFERENCE TO RELATED APPLICATIONS

This application claims priority from Korean Priority Document No. 99-20445, filed on Jun. 3, 1999, and 99-22498, filed on Jun. 16, 1999, both with the Korean Industrial Property Office, which documents are hereby incorporated by reference.

FIELD OF THE INVENTION

This invention relates to semiconductor devices. More particularly, the invention relates to a redundancy selection circuit of a flash memory device and a method of using same that allows testing for defective redundant memory cells.

BACKGROUND OF THE INVENTION

Generally, semiconductor memory devices for storing data are classified into volatile semiconductor memory devices and nonvolatile semiconductor memory devices. The volatile semiconductor memory devices lose their data at power-off, while the nonvolatile semiconductor memory devices maintain their data even at power-off. Therefore, the nonvolatile semiconductor memory devices have been widely used in applications in which power can be interrupted suddenly.

A nonvolatile semiconductor memory device, such as a flash memory device, comprises electrically erasable and programmable ROM cells, each of which is referred to as "a flash EEPROM cell". The flash EEPROM cell includes a cell transistor. As illustrated in FIG. 1, the cell transistor has a semiconductor substrate (or bulk) 2 of a first conductive type (e.g., P-type), and source and drain regions 3 and 4 of a second conductive type (e.g., N-type) spaced from each other. A floating gate 5 for storing charges is placed over a channel region between the source and drain regions 3 and 4, and a control gate 6 placed over the floating gate 5. Gate 5 is understood to have a floating voltage potential. Other structure around it is not shown.

Programming of the flash EEPROM cell is carried out by a hot carrier injection mechanism. The hot carrier injection is performed by applying a high voltage (e.g., +10V) to its control gate 6 and an appropriate positive voltage (e.g., +5V–+6V) to its drain at the drain terminal $V_d$. At this time, the bulk 2 of the EEPROM cell transistor is grounded, along with the source, by grounding the source terminal $V_s$. According to this bias condition of the flash EEPROM cell, hot charge carriers are injected to the floating gate 5 from the channel region adjacent to the drain 4, and thereby the threshold voltage of the EEPROM cell transistor is shifted into a target threshold voltage range for a programmed cell transistor (e.g., 6V–7V).

Erasing of the flash EEPROM cell is carried out by a Fowler-Nordheim (F-N) tunneling mechanism. The F-N tunneling is performed by applying a negative high voltage (e.g., –10V) to its control gate 6 and an appropriate positive voltage (e.g., +5V) to its bulk 2. At this time, its source and drain remain at a high-impedance (or floating) state. According to this bias condition, negative electrons in the floating gate 5 are discharged into the source 3 or into the bulk 2, and thereby the threshold voltage is shifted into a target threshold voltage range for an erased cell transistor (e.g., 1V–3V).

The target threshold voltage distributions of the programmed and erased EEPROM cell transistors are illustrated in FIG. 2.

Reading of the EEPROM cell transistor is carried out by applying a voltage of 4.5V to its gate 6, and a voltage of 1V to its drain 4. During reading, its source 3 and bulk 2 are grounded. According to this bias condition, the programmed EEPROM cell transistor conducts no current from its drain 4 to its source 3, and is referred to as an "OFF" cell. On the other hand, the erased EEPROM cell transistor conducts current from its drain 4 to its source 3, and is referred to as an "ON" cell.

The flash memory device includes an array of the flash EEPROM cells arranged along rows and columns, which are arranged orthogonally to each other. The density of defects generated in such a flash memory device during manufacturing is relatively independent of the integration density of the device, but is dependent on the semiconductor manufacturing technology. The higher the integration density of the device, the greater is the ratio of the number of normal memory cells to that of defective memory cells. Even if the device, however, includes only one defective memory cell therein, the device cannot operate normally, and therefore, the device is abandoned (discarded). This limits the manufacturing yield.

In order to be able to operate the flash memory device in spite of such defective memory cells, a redundant cell array is incorporated in the flash memory device along with the main cell array. In a flash memory device incorporating such a redundant cell array, the manufacturing yield can be improved.

Referring to FIG. 3, a conventional flash memory device includes a main cell array 10 with a plurality of first columns of main memory cells and a redundant cell array 20 with a plurality of second columns of redundant memory cells. Furthermore, the flash memory device includes a circuit 30 for replacing a first column of at least one defective memory cell (or a defective column of main memory cells) with a second column of redundant memory cells. Hereinafter, such a circuit 30 is named "a redundancy selection circuit".

As illustrated in FIG. 3, an address storage block 32 and an input/output coding block 34 constitute the redundancy selection circuit 30. The address storage block 32 stores column addresses for defective columns so that a defective column in the main cell array 10 can be replaced with a redundant column in the redundant cell array 20 by use of fuse elements (e.g., electrical fuses or laser beam fuses). The input/output coding block 34 generates redundancy selection signals $RS_i$ in response to output signals from the address storage block 32. The redundancy selection signals $RS_i$ correspond to input/output pins I/O (in this embodiment, i=0–15) of the flash memory device, respectively.

During reading, a column pass gate circuit 40 responds to output signals from a column decoder circuit 50 and selects a part of first columns in the main cell array 10 and at least one of second columns in the redundant cell array 20. The selected columns of the main cell array 10 correspond to the input/output pins $I/O_0$–$I/O_{15}$, respectively. Simultaneously, a row address decoder 60 decodes row addresses RA into signals $WL_0, \ldots, WL_m$.

Then a sense amplifier SA and write driver WD circuit 70 reads out data from the main cell array 10 via the selected columns. A sense amplifier and write driver circuit 80 reads out data from the redundant cell array 20 via the selected column. If the column address CA inputted in block 32 equals a stored address in the address storage block 32, one of the redundancy selection signals $RS_i$ is activated. This happens because one of the selected columns in the main cell array 10 is defective. Therefore, a multiplexer circuit 90 responds to the activated redundancy selection signal $RS_i$, and selects data read out via the selected column of the redundant cell array 20, instead of data read out via the defective column of the main cell array 10. An I/O buffer 100 outputs the data from multiplexer 90.

A problem arises when the address storage block 32 stores addresses for defective columns by cutting electrical or laser beam fuses incorporated in the blocks 32 and 34 at a wafer level or at a package level. This problem is that it is impossible to test all redundant memory cells in the redundant cell array 20 for defects. In order to solve this drawback, additional circuitry has been used for enabling the redundant memory cells to be estimated. However, the additional circuitry occupies space, which makes the size of the flash memory device increase. Furthermore, cutting the fuses of the redundancy selection circuit 30 takes a long time.

SUMMARY OF THE INVENTION

It is therefore an object of the invention to provide a flash memory device with a redundancy selection circuit, which is capable of testing all redundant memory cells for defects, without limitation.

It is another object of the invention to provide a flash memory device with a redundancy selection circuit, which is capable of reducing test time.

In accordance with one aspect of the present invention, a flash memory device is provided, and a method of using the same.

The flash memory device of the invention includes a main cell array divided into plural input/output blocks, each of which corresponds to the input/output pins and has a bit segment of plural main columns of main memory cells, and a redundancy cell array including a redundant bit segment of plural redundant columns of redundant memory cells. The device also includes a column selector for selecting at least two of the main columns and at least one of the redundant columns in response to a column address. The device additionally includes a plurality of first sense amplifiers each corresponding to the input/output blocks, each for sensing and amplifying stored data in a corresponding input/output block via a corresponding main column thus selected, and at least one second sense amplifier for sensing and amplifying stored data in the redundant cell array via the redundant column thus selected. A plurality of multiplexers are coupled to the input/output pins, each for receiving outputs from a first corresponding sense amplifier and from the second sense amplifier, and for selecting one of the outputs thus received in response to a corresponding one of the redundancy selection signals.

An important part of the invention is a redundancy selection circuit for generating redundancy selection signals, each corresponding to the input/output pins in response to the column address. The redundancy selection circuit includes generation means for simultaneously generating a first redundancy address and a second redundancy address in response to the column address at a read cycle. The first redundancy address indicates whether the column indexed by the column address is defective, and the second redundancy address indicates the place where a defective one of the selected main columns is positioned. The device also includes means for generating the redundancy selection signals in response to the first and second redundancy addresses.

In this embodiment, the flash memory device can perform a test mode of operation in which all the redundant memory cells are tested for defectiveness.

In this embodiment, during the test mode of operation, test addresses are programmed in the generating means such that data on the selected redundant column is outputted at a read cycle of the test mode of operation, regardless of whether defective memory cells exist in the main cell array.

In this embodiment, the generating means comprises an array of a plurality of cell units, each of which includes at least two memory cells that are the same as the main memory cells. Each of the memory cells comprises an electrically erasable and programmable read-only memory (EEPROM) cell, which includes a cell transistor having a source, a drain, a floating gate and a control gate. The gates are connected in common to a word line in the generating means, the drains of the two EEPROM cells are connected in common to a corresponding bit line in the generating means, and the sources of the two EEPROM cells are connected to a source line in the generating means.

In this embodiment, the generating means further includes a decoder for generating selection signals in response to the column address; a second column selector for selecting a part of the bit lines in the generating means in response to the selection signals; and a plurality of third sense amplifiers, each for reading out a data bit signal from the array in the generating means via the selected bit line. The data bit signals that read out by the third sense amplifiers are outputted as the first and second redundancy addresses.

A method according to the invention is to place the flash memory device in a test mode, and testing the main cells. Then a plurality of column addresses is sequentially generated, for each of the redundancy columns. The column addresses are applied to a redundancy selection circuit, which generates redundancy selection signals. The redundancy selection signals are applied to a plurality of multiplexers to select a redundancy column. Then all the redundant cells in the selected redundancy column are tested.

BRIEF DESCRIPTION OF THE DRAWINGS

A more complete appreciation of the present invention, and many of the attendant advantages thereof, will become readily apparent as the same becomes better understood by reference to the following detailed description when considered in conjuction with the accompanying drawings in which like reference symbols indicate the same or similar components, wherein.

DESCRIPTION OF THE PREFERRED EMBODIMENT

The preferred embodiment of the invention will be more fully described with reference to the attached drawings. The present invention will be expressed by use of a flash memory device, particularly by a NOR-type flash memory device having the flash EEPROM cells. However, it will be apparent to one of ordinary skill in the art that the spirit of the present invention is capable of being applied equivalently to other types of semiconductor memory devices.

Figure 4:
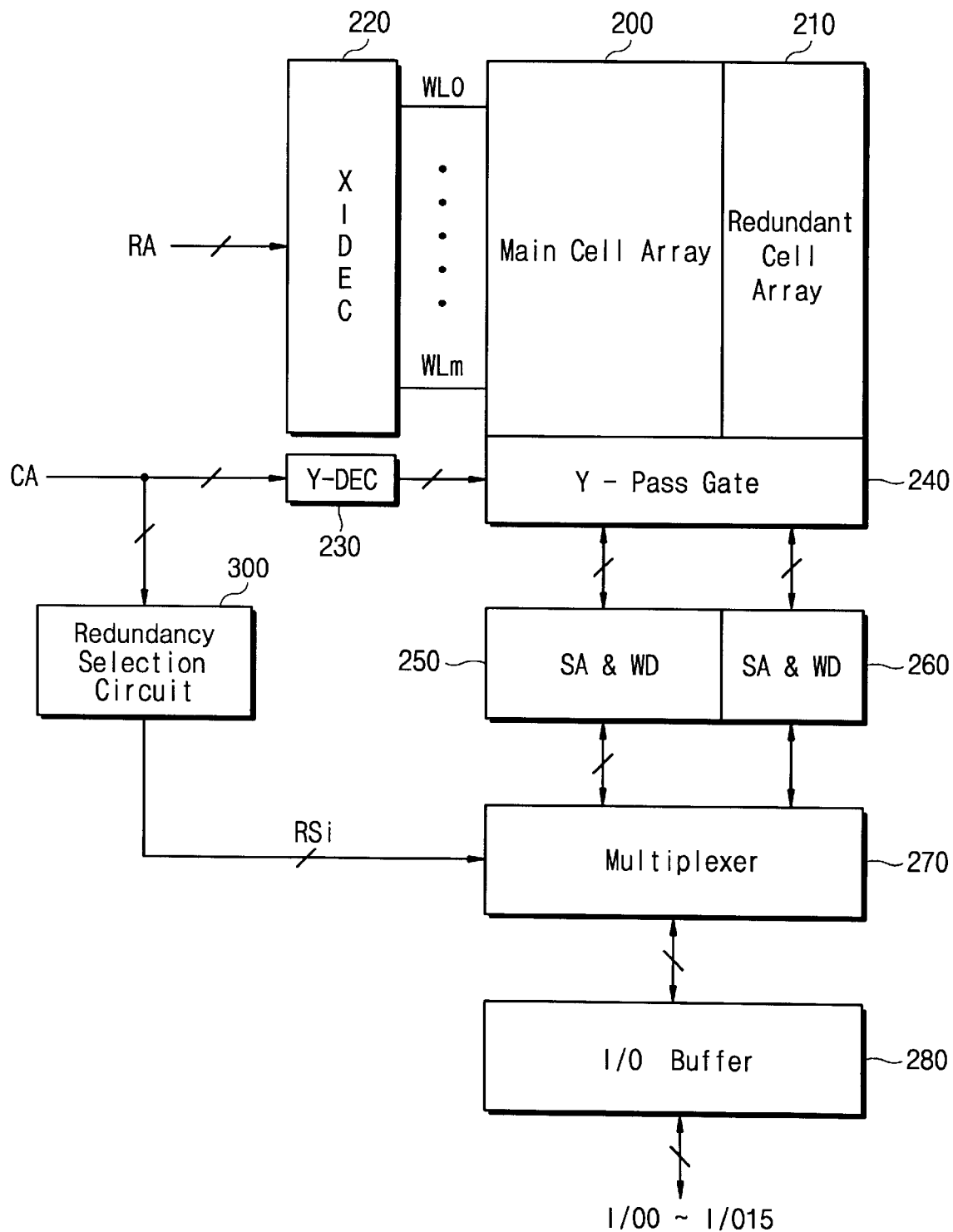
FIG. 4 shows a flash memory device according to the present invention.

Referring to FIG. 4, the flash memory device according to the present invention is illustrated in a block form. The flash memory device includes a main cell array 200, a redundant cell array 210, a row decoder circuit 220, a column decoder circuit 230, a column pass gate circuit 240, a sense amplifier and write driver circuits 250 and 260, a multiplexer circuit 270, and an I/O buffer 280. The above-mentioned constituent elements will be more fully described with reference to FIGS. 5 and 6.

Figure 1:
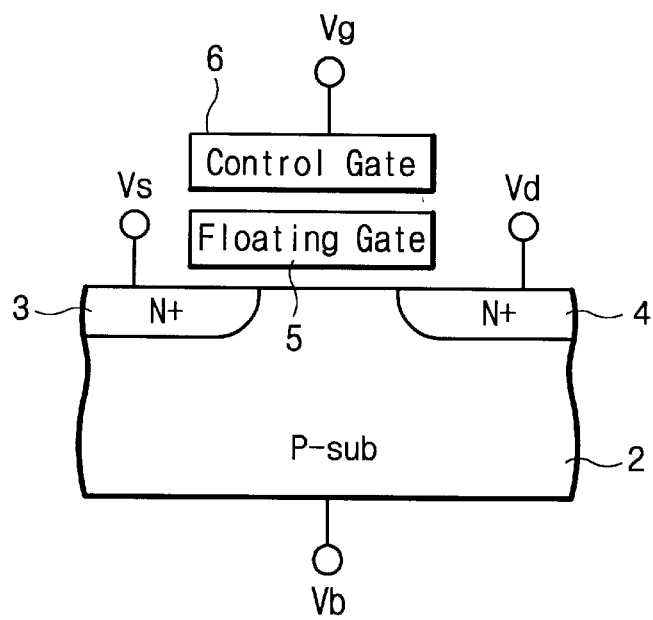
FIG. 1 shows a conventional EEPROM cell transistor.
Figure 2:
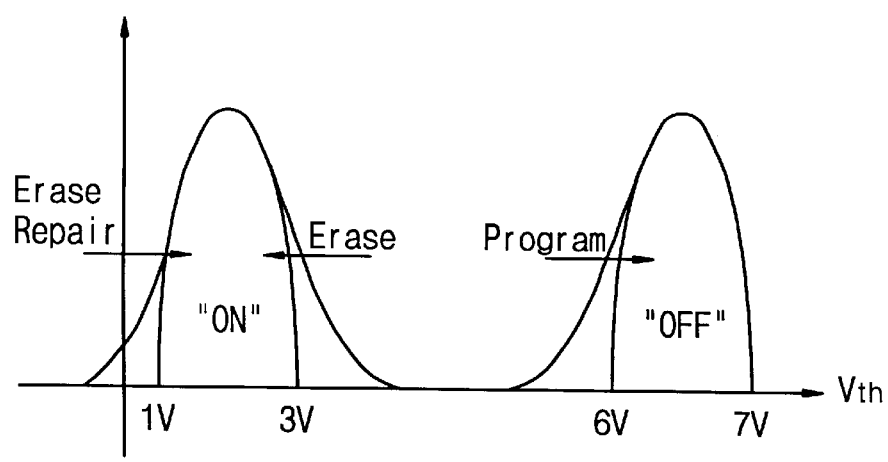
FIG. 2 shows target threshold voltage distributions of ON and OFF cells.
Figure 3:
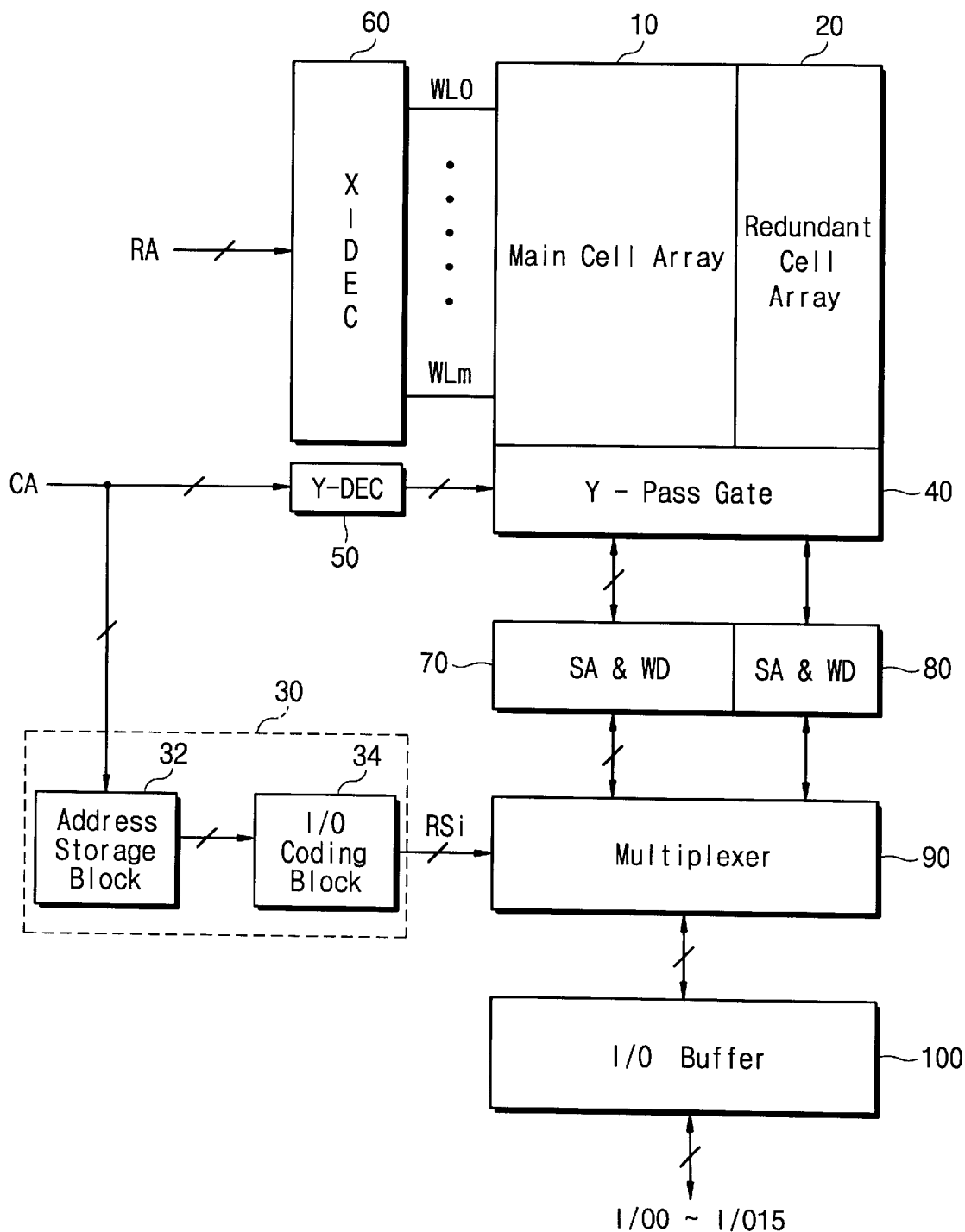
FIG. 3 shows a conventional flash memory device.
Figure 5:
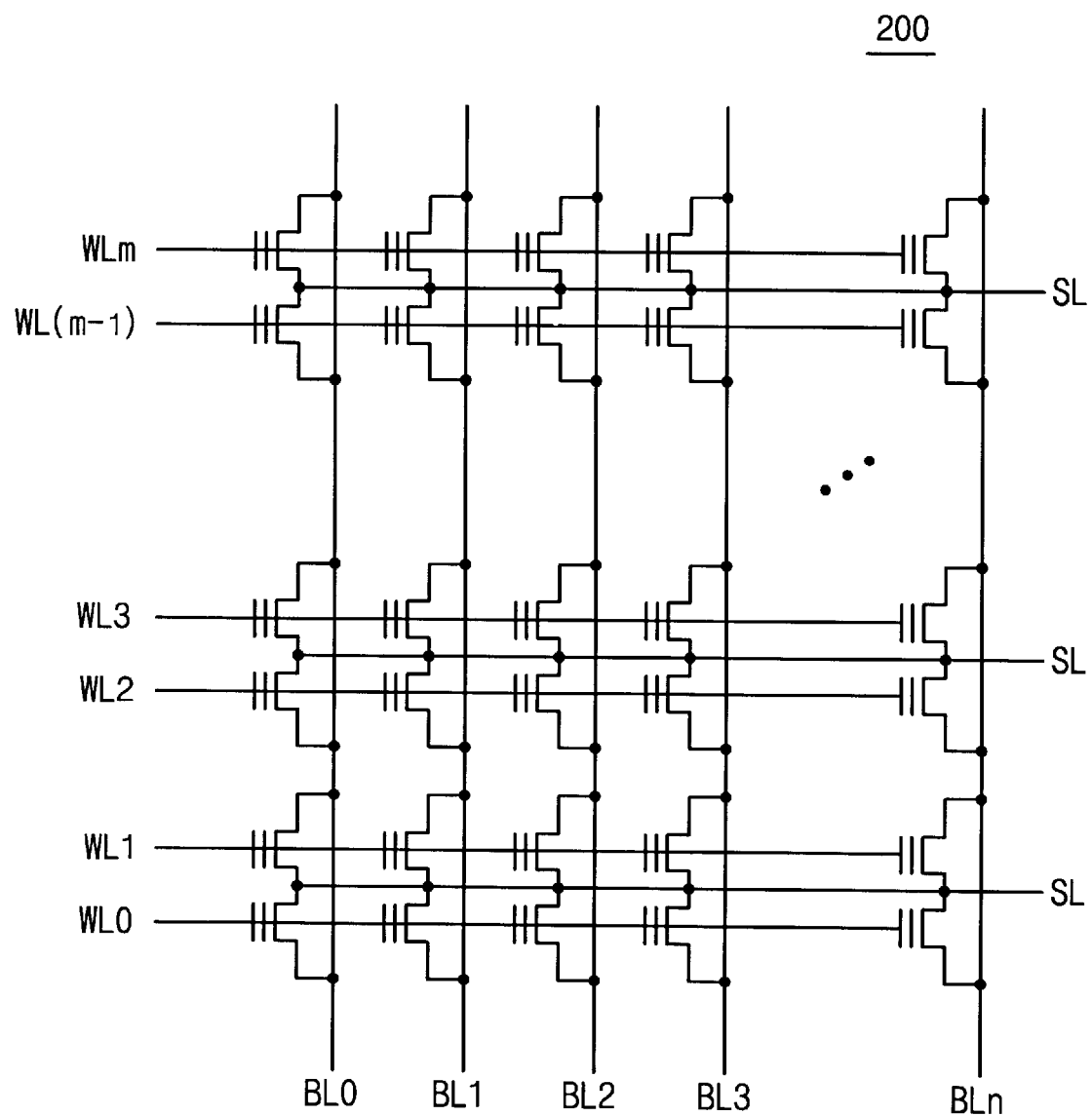
FIG. 5 shows individual transistors of a main cell array illustrated in FIG. 4.

In FIG. 5, the main cell array 200 is illustrated which comprises flash EEPROM cells arranged in a matrix of plural word lines $WL_0$ to $WL_m$, and plural bit lines $BL_0$ to $BL_n$. The cells are also coupled to source lines SL. The flash EEPROM cells have the same configuration and function as that in FIG. 1. That is, programming, erasing and reading of the flash EEPROM cells are performed in the same manner as described above, and description thereof is thus omitted.

Figure 6:
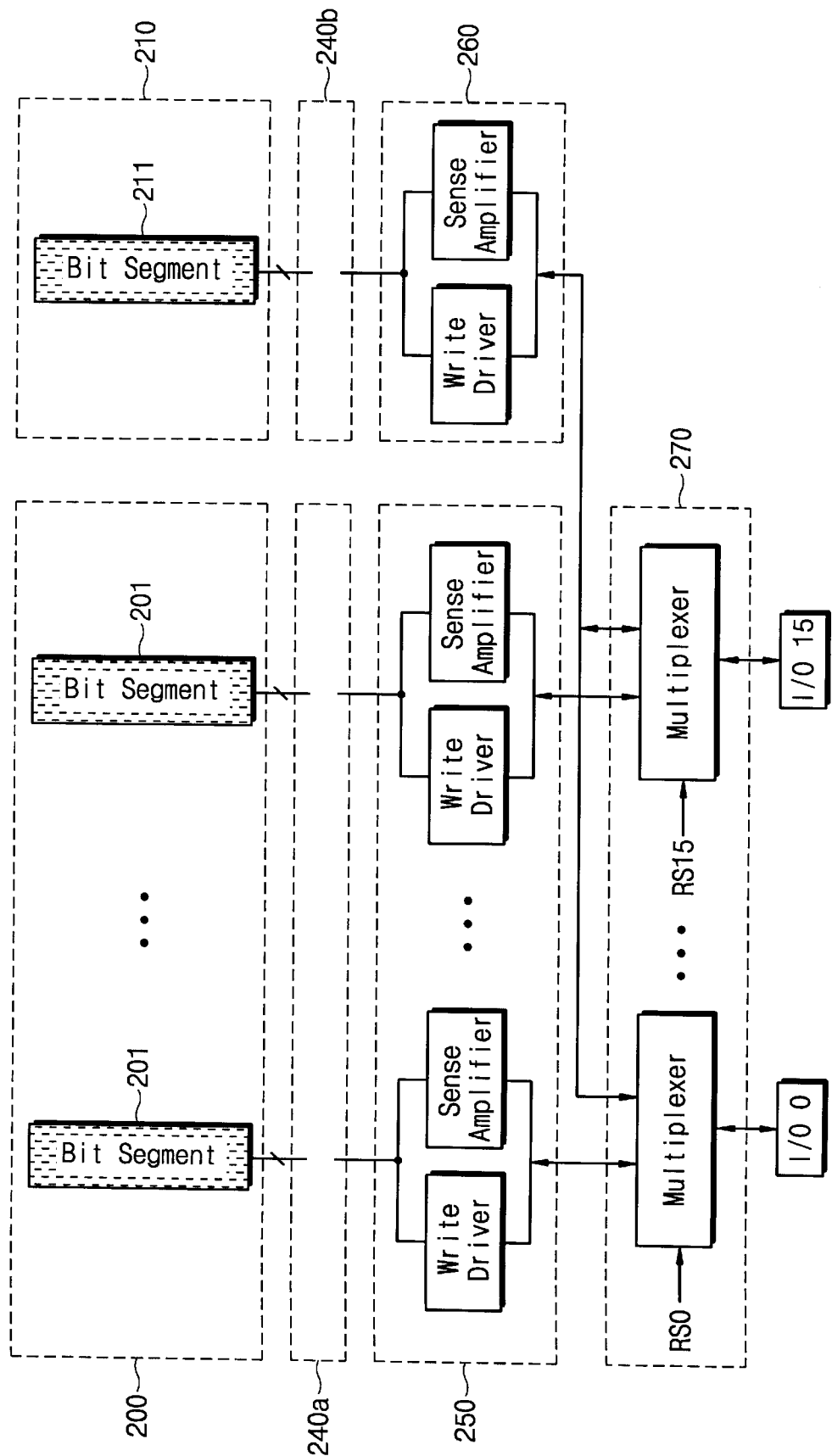
FIG. 6 shows components of a main cell array, a redundant cell array, a column pass gate circuit, a sense amplifier circuit and a multiplexer circuit illustrated in FIG. 4.

Referring to FIG. 6, columns (referred to as "main columns") in the main cell array 200 are, for example, divided into sixteen bit segments (or referred to as "input/output blocks") 201, so as to correspond to sixteen input/output pins $I/O_0$–$I/O_{15}$, respectively. A first column selector 240a selects one of the main columns in each bit segment 201 in accordance with the control of the column decoder circuit 230. The redundancy cell array 210 includes at least one redundant bit segment 211 of plural redundant columns (not shown), and the main cell array 200 and the redundant cell array 210 share the same rows (word lines). A second column selector 240b selects one of the redundant columns in the redundant cell array 210 under the control of the column decoder circuit 230. The first and second column selectors 240a and 240b constitute the column pass gate circuit 240 in FIG. 4.

Sixteen sense amplifiers and sixteen write drivers are provided in the circuit 250, so as to correspond to the input/output pins $I/O_0$–$I/O_{15}$, respectively. Each of the sense amplifiers reads out data from the main cell array 200 via the selected column in a corresponding bit segment 201 at reading, and each of the write drivers drives the selected column in the corresponding bit segment 201 with either a program voltage or a program-inhibit voltage in accordance with a program data. And, one sense amplifier and one write driver are provided in the circuit 260. Output signals from the sense amplifiers 250 corresponding to the main cell array 200 are supplied to corresponding multiplexers 270, respectively. At the same time, an output signal from the sense amplifier corresponding to the redundant cell array 210 is commonly provided to the sixteen multiplexers as illustrated in FIG. 6. Each multiplexer selects one of two input signals thus provided, in response to a corresponding redundancy selection signal $RS_i$.

For example, when the redundancy selection signal $RS_0$ is activated, the multiplexer responds to the redundancy selection signal $RS_0$ and transfers data from the redundant cell array 210 instead of data from the main cell array 200. This means that the selected column in the bit segment 201 corresponding to the first input/output pin $I/O_0$ is defective. On the other hand, when the redundancy selection signal $RS_0$ is inactivated, the multiplexer transfers data from the main cell array 200 instead of data from the redundant cell array 210. This means that the selected column in the bit segment 201 corresponding to the first input/output pin $I/O_0$ is faultless.

Returning to FIG. 4, the flash memory device according to the present invention further includes a redundancy selection circuit 300, which stores addresses, that is, column addresses, corresponding to defective columns in the main cell array 200. This results in the defective columns being replaced with corresponding redundant bit lines in the redundant cell array 210, during normal read and program modes of operation. Furthermore, in the redundancy selection circuit 300, there are programmed column addresses which allow all redundant memory cells in the array 210 to be selected during a test mode of operation. As can be fully appreciated from this description, address information can be freely rewritten in the redundancy selection circuit 300, so that any defective or non-defective cell in the redundant cell array 210 can be selected during the test mode of operation. All of the redundant memory cells are tested by use of the programmed column addresses in the circuit 300 during the test mode of operation. That is, data is read and stored in the redundant memory cells of the array 210. Addresses for defective columns are also stored in the redundancy selection circuit 300 so that defective columns in the main cell array 200 are effectively replaced with corresponding redundant columns in the redundant cell array 210 during normal mode of operation (e.g., programming and reading).

Figure 7:
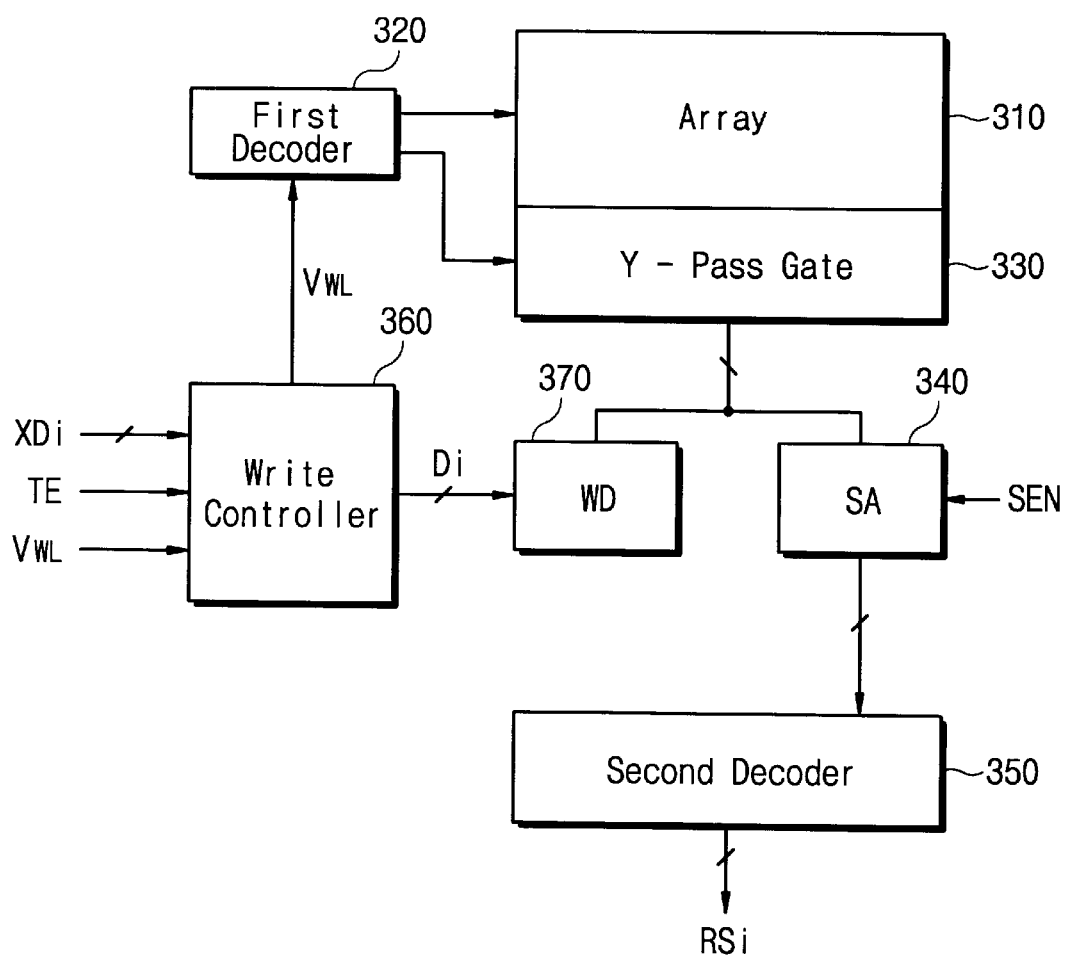
FIG. 7 is a preferred embodiment of a memory cell array having a redundancy selection circuit according to the present invention.

A preferred embodiment of the redundancy selection circuit 300 is illustrated in FIG. 7. The redundancy selection circuit 300 includes an array 310 which stores addresses of defective cells for replacing defective memory cells in the main cell array 200 in FIG. 4 with redundant memory cells in the redundant cell array 210. In the array 310 are also stored addresses for testing all redundant memory cells in the redundant cell array 210 for faulty cells. The array 310 according to the present invention is configured by use of the same flash EEPROM cells as those of the main cell array 200.

Since addresses stored in the array 310 are accessed every read cycle, the memory cells of the array 310 can be affected by more read retention appearance (or soft program appearance) than those of the main cell array 200. Therefore, it is preferred for the array 310 to be free from the well-known drain turn-on (over-erased) and read retention (soft program) phenomena.

Figure 8:
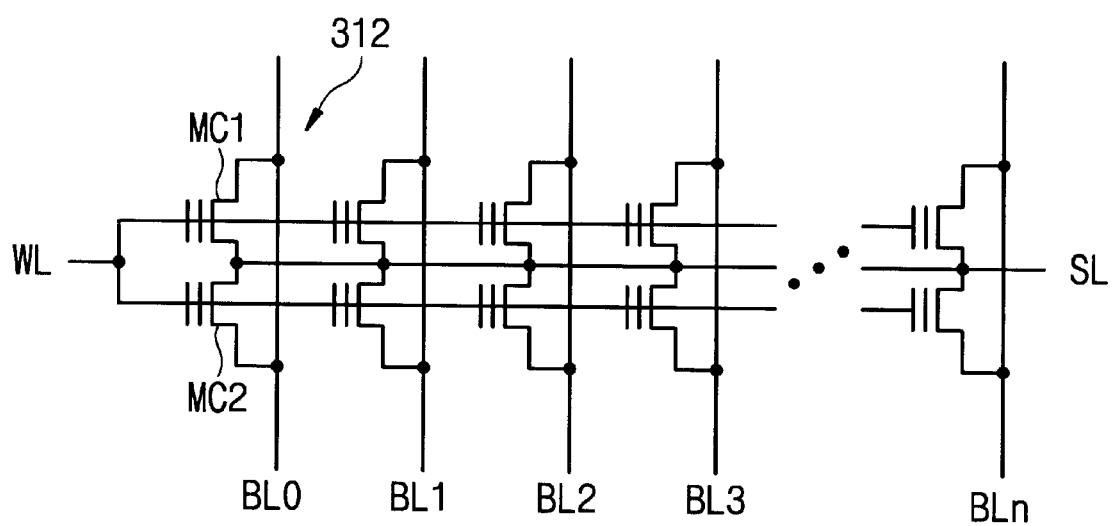
FIG. 8 shows individual transistors of a preferred embodiment of an array illustrated in FIG. 7.

Referring to FIG. 8, which shows a preferred embodiment of the array 310, a plurality of cell units 312, a word line WL, and a plurality of bit lines $BL_0$–$BL_n$ are provided in the array 310. Each of the cell units 312 includes plural, for example, two flash EEPROM cells MC1 and MC2. The flash EEPROM cells MC1 and MC2 include a cell transistor having a drain, a source, a floating gate and a control gate, respectively. The control gates of the EEPROM cell transistors in each cell unit 312 are coupled in common to the word line WL, their sources are coupled in common to a source line SL and their drains are coupled in common to a corresponding bit line $BL_n$.

The array 310 has the advantages of the structures illustrated in FIGS. 9A and 9B, so that the cells of the array 310 are free from the drain turn-on and read retention appearance, as is more fully described below.

Figure 9A:
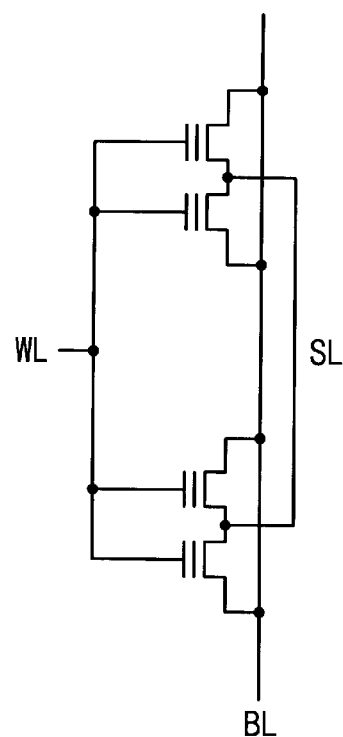
FIGS. 9A and 9B show the array structures in order to avoid the soft program and drain-turn on problem.

First, referring to FIG. 9A, the array structure to avoid the soft program problem is illustrated. The EEPROM cell transistors are connected in parallel to a bit line BL and are coupled in common to a word line WL. In particular, the control gates of the cell transistors are coupled in common to the word line WL, the drains thereof are coupled in common to the bit line BL, and the sources thereof are coupled in common to a source line SL. That is, 1-bit data is stored in a plurality of EEPROM cells connected in parallel to each other. Therefore, in the case that a part of the EEPROM cells are soft-programmed, if at least one EEPROM cell acts as the ON cell, data can be read out from a cell unit of the EEPROM cells. The array structure of FIG. 9A also has another advantage, such as improved sensing speed.

Figure 9B:
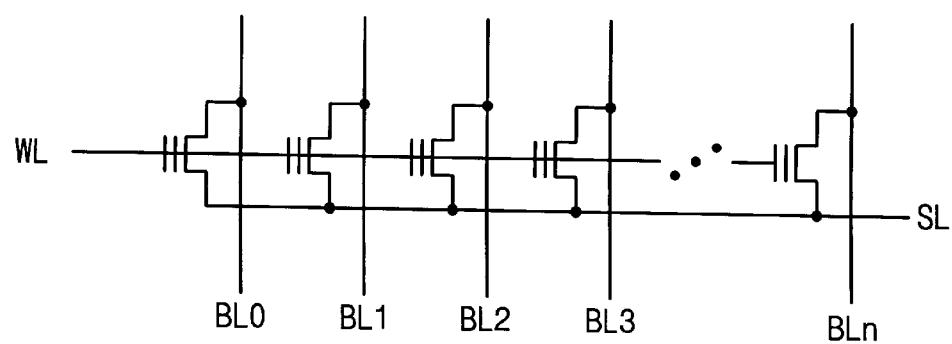

As illustrated in FIG. 9B, a plurality of EEPROM cells are coupled in parallel to a word line WL, in order that the cells of the array 310 are free from the drain turn-on phenomenon. Also, each of the plural EEPROM cells is coupled to a corresponding bit line $BL_0$–$BL_n$. According to the configuration, even if one EEPROM cell is over-erased, other EEPROM cells will not be affected by the over-erased cell. That is, the cells of the array 310 are free from the drain turn-on phenomenon.

As a result, since the array 310 has the advantages of the structures illustrated in FIGS. 9A and 9B, the cells of the array 310 are free from the drain turn-on and read retention phenomena. Furthermore, the cells of the array 310 are erased so as to have a threshold voltage of 0V or a negative threshold voltage. By using such an erase scheme, a relatively low voltage can be applied to the word line WL at the read cycle of the main memory cell and the array 310 in FIG. 7. Accordingly, less stress is applied to the cells of the array 310 and thereby the read retention (soft program) phenomenon can be prevented.

Returning to FIG. 7, the redundancy selection circuit 300 further includes a first decoder 320, a column pass gate circuit 330, a sense amplifier circuit 340, a second decoder 350, a write controller 360 and a write driver circuit 370. The first decoder 320 receives address signals Ai to decode the received address signals. As described above, since only one word line WL is arranged in the array 310, the decoded address signals are used as signals for selecting the bit lines $BL_0$–$BL_n$ of the array 310. The word line WL is then supplied with a power supply voltage at the read cycle, which is less than a word line voltage to the main cell array 200. This is because the cells in the array 310 have threshold voltages of 0V or the negative voltage level. The column pass gate circuit 330 selects at least two of the bit lines $BL_0$–$BL_n$, in response to output signals from the first decoder 320. For example, five ones of the bit lines $BL_0$–$BL_n$, are selected by the column pass gate circuit 330. Therefore, the sense amplifier circuit 340 includes five sense amplifiers, and the write driver circuit 370 includes five write drivers.

At a read cycle, the sense amplifiers 340 of the redundancy selection circuit 300 operate in synchronism with those associated with the main cell array 200. A data word of five bits read out from the array 310 is used as information for replacing a defective column of the main cell array 200 with a corresponding redundant column. A most significant bit (MSB) signal of the five data bit word, also known as a first redundancy address, indicates whether or not the column indexed by the address Ai to the first decoder 320 is defective. The remaining four of the five data bits form a second redundancy address. The second redundancy address is used to select one of the multiplexers 270, each corresponding to the input/output pins $I/O_0$–$I/O_{15}$. For example, when the MSB signal indicates that the column indexed by column address Ai is defective, it has a logic high level. On the other hand, when the MSB signal indicates that the column indexed by column address Ai is faultless, it has a logic low level. As seen from the above description, the first decoder, the array and the sense amplifier circuit constitute means for generating the first redundancy address and the second redundancy address.

Continuing to refer to FIG. 7, the second decoder 350 decodes the output signals from the sense amplifier circuit 340 to output redundancy selection signals $RS_0$–$RS_{15}$, which correspond to the multiplexers 270 respectively. When the MSB signal from the sense amplifier circuit 340 is activated high, the second decoder 350 activates one of the redundancy selection signals $RS_0$–$RS_{15}$ in response to the rest of output signals from the circuit 340.

Address information for testing the redundant cell array 210 and for replacing defective columns of the main cell array 200 is programmed in the array 310 under the control of the write controller 360. In order to program the address information, first, the flash memory device enters a test mode of operation. At the test mode of operation, the write controller 360 responds to a test signal TE to control programming of the array 310. For example, the write controller 360 receives data XDi to be programmed in the array 310 to transfer the received data Di to the write driver circuit 370. Voltages required to programming are provided either externally, or from a high voltage generating circuit (not shown) used in the flash memory device.

Assume that the voltages required for programming are provided externally. Under this assumption, the write controller 360 receives a high voltage $V_{WL}$ to be supplied to the word line WL of the array 310 to transfer the received high voltage $V_{WL}$ to the first decoder 320. The write driver circuit 370 drives bit lines that are selected by the first decoder 320 and the column pass gate circuit 330, with a program voltage or a program-inhibit voltage in accordance with the received data Di. Under this bias circumstance, EEPROM cells arranged in the word line and the selected bit lines are programmed.

According to the present invention, the redundancy selection circuit 300 of FIG. 4 stores addresses of defective cells by use of flash EEPROM cells similar to those of the main memory cell 200, instead of electrical or laser beam fuses. It means that addresses required to test all redundant memory cells of the array 210 can be programmed without limitation. Therefore, since a separate circuit for testing the redundant memory cells is not needed, the size of the flash memory device is not increased even with incorporating the function of testing redundant memory cells for defaults. Furthermore, the process is faster than the prior art's fuse cutting process. As such, the overall test time of the flash memory device is decreased, and the test cost of the flash memory device is reduced.

A method according to the invention has been described. The method is for testing a flash memory device having a plurality of main cells, and a plurality of redundant cells arranged in redundancy columns and distinct from the main cells. The method includes placing the flash memory device in a test mode, and testing at least one of the main cells. Testing the main cells can take place before or after testing the redundancy cells.

Then a plurality of column addresses is sequentially generated. The column addresses correspond to at least some, and preferably all, of the redundancy columns.

Then each column address is applied to a redundancy selection circuit, which generates redundancy selection signals. The redundancy selection signals are applied to a plurality of multiplexers to select a redundancy column. Then some, and preferably all, of the redundant cells in the selected redundancy column are tested.

The invention has been described using the exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A flash memory device comprising:
a main memory cell array divided into plural input/output blocks, each of which corresponds to input/output pins, the array having a bit segment of plural main columns of main memory cells;
a redundant memory cell array including a redundant bit segment of plural redundant columns of redundant memory cells;
a column selector for selecting at least one main column and at least one redundant column in response to a column address;
a plurality of first sense amplifiers each corresponding to the input/output blocks, each for sensing and amplifying stored data in a corresponding input/output block via a corresponding at least one main column selected by the column selector;
at least one second sense amplifier for sensing and amplifying stored data in the redundant cell array via the at least one redundant column selected by the column selector;
a redundancy selection circuit for generating redundancy selection signals each corresponding to one of the input/output pins, wherein the redundancy selection circuit includes generating means for simultaneously generating a first redundancy address and a second redundancy address in response to the column address at a read cycle, the first redundancy address indicating whether the column indexed by the column address is defective and the second redundancy address indicating where a defective one of the at least one main columns is positioned, the redundancy selection circuit generating the redundancy selection signals in response to the first and second redundancy addresses; and wherein the generating means comprises a storage array with a plurality of cell groups, each cell group having a plurality of cells, the plurality of cell groups arranged in a matrix of rows and columns so that all cells in a row of cell groups are commonly connected to a single word line and all cells in a column of cell groups are commonly connected to a single bit line; and
a plurality of multiplexers each coupled to one of the input/output pins, each for receiving outputs from a first corresponding sense amplifier and from a second sense amplifier and for selecting one of the received outputs in response to a corresponding one of the redundancy selection signals.

2. The flash memory device according to claim 1, wherein the flash memory device has a test mode of operation in which all the redundant memory cells in the redundant memory cell array are tested for defects.

3. The flash memory device according to claim 2, wherein during the test mode of operation, test addresses are programmed in the generating means such that data on the at least one redundant column is outputted at a read cycle of the test mode of operation regardless of whether any of the main memory cells in the main cell array is defective.

4. The flash memory device according to claim 3, wherein each of the plurality of cell groups within the storage array includes at least two memory cells that are the same as the main memory cells.

5. The flash memory device according to claim 4, wherein each of the at least two memory cells in the generating means comprises an electrically erasable and programmable read-only memory cell, which includes a cell transistor having a source, a drain, a floating gate, and a control gate.

6. The flash memory device according to claim 5, wherein the gates of the at least two memory cells are connected in common to the corresponding one of a plurality of word lines, the drains of the at least two memory cells are connected in common to the corresponding one of a plurality of bit lines, and the sources of the at least two memory cells are connected in common to a source line in the generating means.

7. The flash memory device according to claim 6, wherein a selected word line in the array of the generating means is supplied with a power supply voltage at a read cycle.

8. The flash memory device according to claim 4, wherein the generating means further comprises:
a decoder for generating selection signals in response to the column address;
a second column selector for selecting at least one of the bit lines in the generating means in response to the selection signals; and
a plurality of third sense amplifiers each for reading out data bit signals from the array in the generating means via the selected bit line, wherein the read data bit signals by the third sense amplifiers are outputted as the first and second redundancy addresses.

9. The flash memory device according to claim 8, wherein the third sense amplifiers in the generating means operate in synchronism with the first sense amplifiers associated with the main memory cell array.

10. The flash memory device according to claim 8, wherein the generating means further comprises a write controller for controlling programming of the test addresses and the addresses of the defective cells.

11. A method for testing a flash memory device having a plurality of main cells, a plurality of redundant cells arranged in redundancy columns and distinct from the main cells, and a storage array with a plurality of cell groups, each cell group having a plurality of cells, the plurality of cell groups arranged in a matrix of rows and columns so that a gate of every cell in a row of cell groups is commonly and directly connected to a single word line that corresponds to the row of cell groups and so that a drain of every cell in a column of cell groups is commonly and directly connected to a single bitline that corresponds to the column of cell groups, the method comprising:
placing the flash memory device in a test mode;
testing at least one of the main cells;
generating sequentially a plurality of column addresses that correspond to all the redundancy columns;
applying each column address to a redundancy selection circuit for generating redundancy selection signals; and
applying the redundancy selection signals to a plurality of multiplexers to select a redundancy column; and
testing all the redundant cells in the selected redundancy column.

* * * * *

UNITED STATES PATENT AND TRADEMARK OFFICE
CERTIFICATE OF CORRECTION

PATENT NO. : 6,735,727 B1 Page 1 of 1
DATED : May 11, 2004
INVENTOR(S) : Lee

It is certified that error appears in the above-identified patent and that said Letters Patent is hereby corrected as shown below:

Column 2,
Line 52, "pins I/O (in this" should read -- pins $I/O_i$ (in this --.

Signed and Sealed this

Twenty-second Day of March, 2005

JON W. DUDAS
*Director of the United States Patent and Trademark Office*